United States Patent
Bisen

(10) Patent No.: US 8,917,559 B2
(45) Date of Patent: Dec. 23, 2014

(54) MULTIPLE WRITE OPERATIONS WITHOUT INTERVENING ERASE

(75) Inventor: Omprakash Bisen, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 281 days.

(21) Appl. No.: 13/465,351

(22) Filed: May 7, 2012

(65) Prior Publication Data

US 2013/0265830 A1 Oct. 10, 2013

(30) Foreign Application Priority Data

Apr. 4, 2012 (IN) .......................... 1357/CHE/2012

(51) Int. Cl.
*G11C 11/34* (2006.01)

(52) U.S. Cl.
USPC ............ 365/185.29; 365/185.11; 365/185.18; 365/185.24

(58) Field of Classification Search
CPC ..... G11C 16/16; G11C 14/16; G11C 16/3445
USPC .............. 365/185.29, 185.11, 185.14, 185.18
See application file for complete search history.

(56) References Cited

U.S. PATENT DOCUMENTS

| | | | |
|---|---|---|---|
| 5,555,204 A * | 9/1996 | Endoh et al. | 365/185.22 |
| 5,936,884 A | 8/1999 | Hasbun et al. | |
| 7,529,136 B2 | 5/2009 | Micheloni et al. | |
| 7,656,713 B2 * | 2/2010 | Cernea | 365/185.22 |
| 7,877,539 B2 * | 1/2011 | Sinclair et al. | 711/103 |
| 7,978,529 B1 | 7/2011 | Compagno | |
| 8,117,400 B2 * | 2/2012 | Zamsky et al. | 711/142 |
| 8,131,915 B1 | 3/2012 | Yang | |
| 2002/0149963 A1 | 10/2002 | De Sandre et al. | |
| 2009/0161466 A1 | 6/2009 | Hamilton et al. | |
| 2010/0103735 A1 | 4/2010 | Kim et al. | |

OTHER PUBLICATIONS

The International Search Report and Written Opinion of the International Searching Authority mailed Aug. 7, 2013 in International Application No. PCT/US2013/034155, 11 pages.

* cited by examiner

*Primary Examiner* — Son Dinh
(74) *Attorney, Agent, or Firm* — Toler Law Group, PC

(57) ABSTRACT

A method may be performed by a data storage device and includes writing first data to a group of storage elements. Each particular storage element of the group of storage elements is assigned to a particular state of a first set of states based on a first data value to be stored in the particular storage element. The method also includes overwriting the first data in the group of storage elements with second data. Each particular storage element of the group of storage elements is assigned to a particular state of a second set of states based on a second data value to be stored in the particular storage element. At least one state is included in the first set of states and is excluded from the second set of states.

20 Claims, 3 Drawing Sheets

US 8,917,559 B2

MULTIPLE WRITE OPERATIONS WITHOUT INTERVENING ERASE

CLAIM OF PRIORITY

The present application claims priority from Indian Patent Application No. 1357/CHE/2012 filed on Apr. 4, 2012, which is incorporated herein in its entirety.

FIELD OF THE DISCLOSURE

The present disclosure is generally related to storing data in a non-volatile memory.

BACKGROUND

Non-volatile data storage devices, such as universal serial bus (USB) flash memory devices or removable storage cards, have allowed for increased portability of data and software applications. Flash memory devices can store a data value in a memory cell by injecting charge into a floating gate of a transistor, altering a threshold voltage of the transistor. A threshold voltage within a first voltage range may correspond to one data value while a threshold voltage within a second voltage range may correspond to another data value. Applying a sensing voltage to a control gate of the transistor enables detection of the threshold voltage and therefore the data value that is stored in the memory cell. For example, a sensing voltage that is higher than the threshold voltage of the transistor will enable a higher current through the transistor than a sensing voltage that is lower than the threshold voltage.

Such memory cells may be erased and re-programmed to store other data. Conventionally, erasing flash memory cells is time-consuming and can affect data write latency of a data storage device. In addition, erasing data in a flash memory may require erasing multiple memory pages that are within an erase block of the memory. Memory management or "housekeeping" operations associated with erasing a memory block, such as copying valid data from the erase block to another memory location prior to erasing the erase block, may also impact write latency at the data storage device.

SUMMARY

Sequential write operations may be performed to write data to a group of storage elements at a non-volatile memory without intervening erase operations. Each write operation corresponds to a different set of states of the storage elements. For example, a first write operation may store first data using a first state or a second state of a storage element. A second write operation may overwrite the first data and store second data using the second state or a third state (but not the first state) of the same storage element. Additional write operations may also be performed after the second write operation. After the group of storage elements is programmed to a last set of states, an erase operation may be performed to return the group of storage elements to the first state.

DETAILED DESCRIPTION

Figure 1:
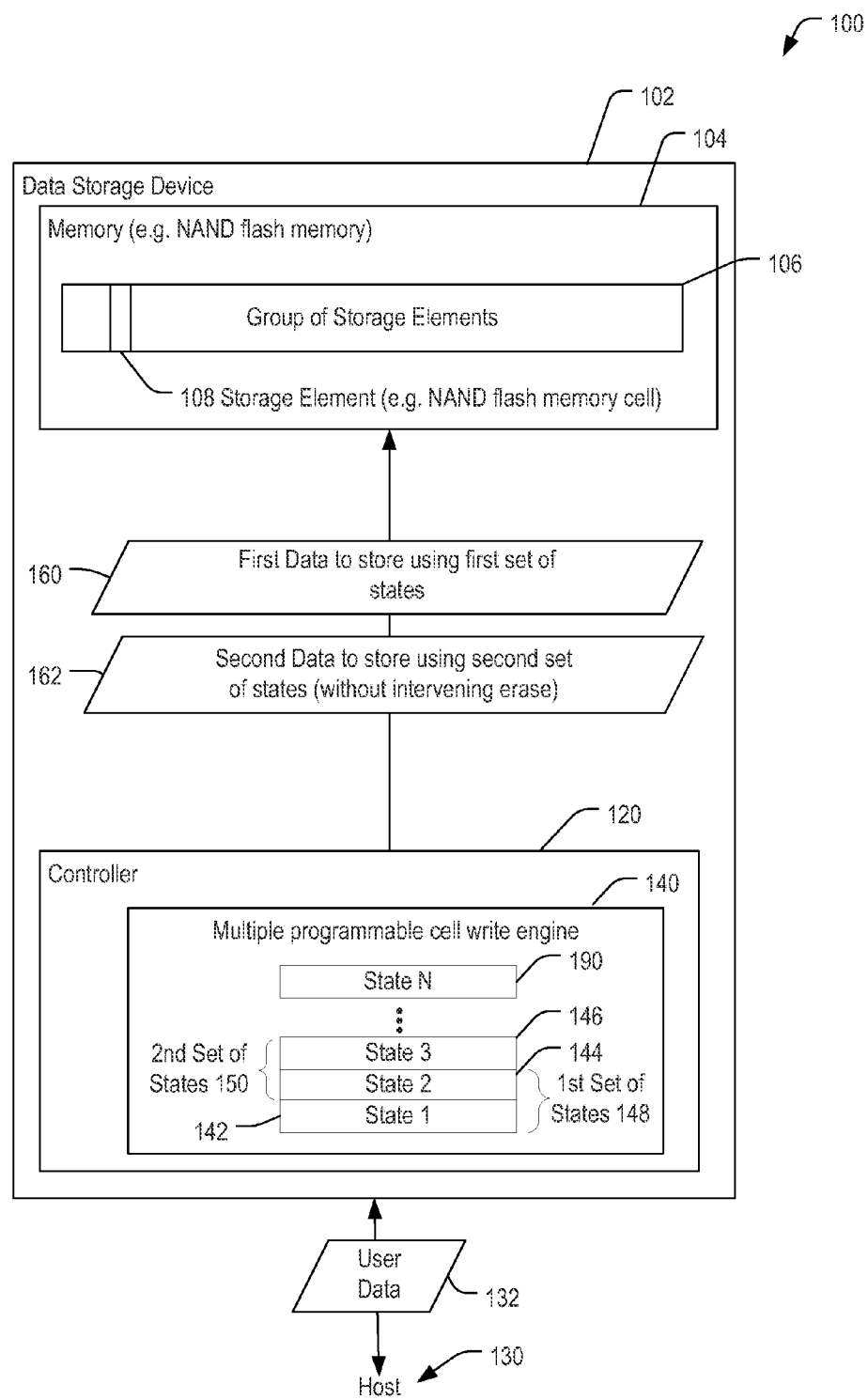
FIG. 1 is a block diagram of a particular illustrative embodiment of a system including a data storage device configured to overwrite first data with second data without performing an intervening erase operation.

Referring to FIG. 1, a particular embodiment of a system 100 includes a data storage device 102 coupled to a host device 130. The data storage device 102 is configured to overwrite data stored at a memory 104, without performing an intervening erase operation, by reprogramming storage elements from a first set of states to a second set of states. The second set of states excludes at least one state that is in the first set of states.

The host device 130 may be configured to provide data, such as user data 132, to be stored at the memory 104 or to request data to be read from the memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the memory 104 coupled to a controller 120. The memory 104 may be a non-volatile memory, such as a NAND flash memory. The memory 104 includes a representative group 106 of storage elements, such as a word line of a NAND flash memory. The group 106 includes a representative storage element 108, such as a flash memory cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes a multiple programmable cell write engine 140 that is configured to write first data 160 to the group 106 using a first set of states 148 and to overwrite the first data 160 with second data 162 using a second set of states 150. For example, each storage element of the group 106 of storage elements may be configured to be placed into one of multiple states, such as a representative first state 142, a representative second state 144, a representative third state 146, and a representative Nth state 190 (N is a positive integer greater than 3). To illustrate, the group 106 may be a word line of flash memory cells that are programmable to have a threshold voltage within a first, second, third, or Nth voltage range corresponding to the first state 142, the second state 144, the third state 146, or the Nth state 190, respectively, as described in further detail with respect to FIG. 2.

The multiple programmable cell write engine 140 may be configured to update states of all storage elements in the group 106 during write operations to be in a particular set of states (as used herein, "write operations" and "overwrite operations" are used interchangeably). The multiple programmable cell write engine 140 may maintain a table or other mechanism to track a number of write operations that have been performed at each particular group of multiple programmable storage elements in the memory 104 since a most recent erase event at the particular group. Alternatively, or in addition, the multiple programmable cell write engine 140 may maintain a table or other mechanism to track a current set of states for each particular group of multiple programmable storage elements in the memory 104. Upon receiving an instruction to perform a write operation to a group of storage elements, such as the group 106, the multiple programmable cell write engine 140 may determine a current set of states of storage elements of the group (e.g. the first set of states 148) and designate a next set of states to implement the write operation (e.g. the second set of states 150 may be used to overwrite data that is stored in the group 106 using the first set of states 148).

Data may be read from the group 106 based on which set of states corresponds to the storage elements in the group 106. For example, when the storage elements of the group 106 correspond to the first set of states 148, data may be read from the storage elements by determining whether each storage element is in the first state 142 or in the second state 144. Alternatively, because the storage elements in the group 106 are constrained to be in either the first state 142 or the second state 144, data may be read by determining whether or not each storage element in the group 106 is in the first state 142 (or by determining whether or not each storage element is in the second state 144). When the storage elements of the group 106 correspond to the second set of states 150, data may be read from the storage elements by determining whether or not each storage element is in the second state 144 (or alternatively, by determining whether or not each storage element is in the third state 146).

The multiple programmable cell write engine 140 may be configured to identify when the storage elements of the group 106 correspond to a "highest" set of states (e.g. a set of states including the Nth state 190, such that no additional state exists to enable overwriting of existing data) and to cause an erase operation to be performed (e.g. to return the storage elements of the group 106 to the first state 142 (or to another state)) prior to another write operation being performed at the group 106. After an erase operation is performed, data may be stored to the group 106 using the first set of states 148. Thus, a number of successive write operations that may be performed at the group 106, without an intervening erase operation, may be based on a number of available states (e.g. N states) and a number of states in each set of states (e.g. two states per set). For example, in an implementation where N=8 and using two states per set of states, seven successive write operations may be performed.

During operation, the controller 120 may be configured to receive the user data 132 from the host device 130 and to determine that the user data 132 is to be stored to the group 106. The multiple programmable cell write engine 140 may be configured to determine that the storage elements of the group 106 have been erased and are in the first state 142. The multiple programmable cell write engine 140 may determine that the first data 160 (e.g. an encoded version of the user data 132) is to be programmed to the group 106 using the first set of states 148. For example, each data value (e.g. each bit) in the first data 160 may be stored in a distinct storage element of the group 106 using either the first state 142 or the second state 144. Each storage element in the group 106 is set to either the first state 142 or the second state 144 based on whether the particular data value of the first data 160 that is stored in the storage element is a logical "0" value or a logical "1" value.

The multiple programmable cell write engine 140 may designate that a first logical value, such as a logical "0" value, is assigned to the second state 144 and a second logical value, such as a logical "1" value, of the user data 132 is assigned to the first state 142. The controller 120 may send the first data 160 (e.g. an encoded version of the user data 132) to be programmed to the group 106 using the first set of states 148 by setting each storage element storing a logical "0" value of the first data 160 to the second state 144 and by leaving each storage element storing a logical "1" value of the first data 160 in the first state 142. After the first data 160 has been stored in the memory 104, the multiple programmable cell write engine 140 may update an internal table or other tracking mechanism to indicate that the group 106 has been programmed to the first set of states 148.

After writing the first data 160 to the group 106, the controller 120 may receive second data 162 to be stored to the group 106. The multiple programmable cell write engine 140 may determine that the storage elements of the group 106 are in the first set of states 148 (e.g. by reading the internal table or tracking mechanism) and may determine that the second data 162 is to be programmed to the group 106 using the second set of states 150. For example, each data value (e.g. each bit) in the second data 162 may be stored in a distinct storage element of the group 106 using the second state 144 or the third state 146. Each storage element in the group 106 is set to either the second state 144 or the third state 146 based on whether the particular data value of the second data 162 that is stored in the storage element is a logical "0" value or a logical "1" value. The controller 120 may instruct storage of the second data 162 at the group 106 using the second set of states 150 without first performing an erase operation to the storage elements of the group 106.

Successive data write operations may be performed to the group 106 without intervening erase operations until at least one of the storage elements of the group 106 is programmed to the Nth state 190. Thereafter, when a subsequent set of data is to be stored to the group 106, the multiple programmable cell write engine 140 may determine that no additional states are available for overwriting at the group 106 and may cause the controller 120 to initiate an erase operation of the group 106 to return all storage elements of the group 106 to the first state 142. After returning the storage elements to the first state 142, data may be programmed according to the first set of states 148.

In response to a request being received to read data from the group 106, such as to read the second data 162, the multiple programmable cell write engine 140 (or other logic in the controller 120) may determine a current set of states of the group 106, such as the second set of states 150. For example, when the controller 120 determines that the storage elements of the group 106 are in the second set of states 150, the controller 120 may instruct the memory 104 to perform a read of the data in the group 106 by determining whether each storage element in the group 106 is in the third state 146 or not in the third state 146.

Updating states of the storage elements of the group 106 during each write operation (to correspond to an updated set of states for the group 106) reduces write latency as compared to implementations where storage elements are allowed to remain in a state through multiple write operations. For example, in an implementation where a data value in a storage element is read as a "0" value when the storage element is in a highest permitted state and is read as a "1" value otherwise, and where a particular storage element stores a "1" value during each of multiple successive write operations by remaining in a lower state (e.g. an initial state) while storage elements storing "0" values are programmed to increasingly higher states with each successive write operation, the storage element undergoes a multi-state transition when a "0" value is eventually written to the storage element. In an implementation where an amount of time required to transition the storage element from the initial state (corresponding to the logical "1" value) to the highest permitted state (corresponding to the logical "0" value) is proportional to the number of states between the initial state and the final state, the larger multi-state transition of the storage element would require more time than single-state and dual-state transitions of other storage elements being programmed and will therefore delay completion of the write operation (increasing write latency).

However, by changing the states of all storage elements in the group 106 from the first state 142 to either the second state 144 or the third state 146 when writing the second data 162, a number of state changes that any of the storage elements will later have to undergo (e.g. when a logical "0" value is written to the storage element) may be reduced, as described in further detail with respect to FIG. 2. As a result, a write latency may be reduced by avoiding transitions across large numbers of states.

Figure 2:
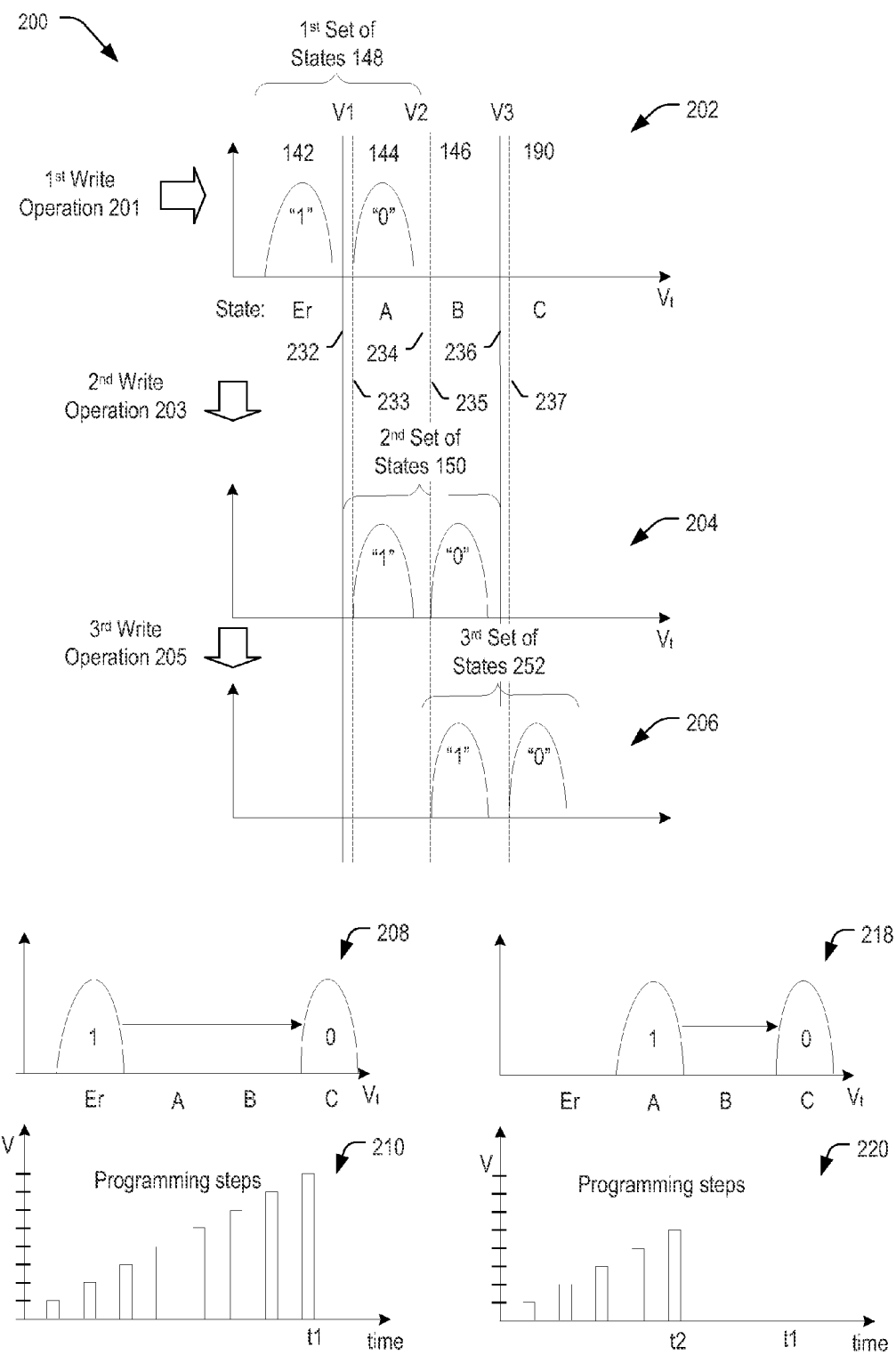
FIG. 2 is a general diagram illustrating a particular embodiment of writing first data to a group of cells and overwriting the first data with second data that may be performed by the data storage device of FIG. 1.

Referring to FIG. 2, an example of writing data to the storage element 108 of FIG. 1 is depicted and generally designated 200. In the example 200, the storage element 108 is implemented as a flash memory cell. A first graph 202 illustrates possible states of the storage element 108 as states of the flash memory cell in response to a first write operation having been performed. The flash memory cell has a series of four defined states according to ranges of threshold voltage of the cell (i.e. N=4). For example, the storage element 108 may be in the first state ("Er") 142, the second state ("A") 144, the third state ("B") 146, or the fourth state ("C") 190. The first state 142 corresponds to a range of threshold voltages less than a first sensing voltage (V1) 232. The second state 144 corresponds to a range of threshold voltages greater than or equal to the first sensing voltage 232 and less than a second sensing voltage (V2) 234. The third state 146 corresponds to a range of threshold voltages greater than or equal to the second sensing voltage 234 and less than a third sensing voltage (V3) 236. The fourth state 190 corresponds to a range of threshold voltages greater than or equal to the third sensing voltage 236. The storage element 108 may be initialized to be in the first state 142, such as following an erase operation performed at the group 106 of FIG. 1.

Upon performing a first write operation 201, if the storage element 108 is assigned a logical "1" value, the storage element 108 may not be programmed and may remain in the first state 142. Otherwise, if the storage element 108 is assigned a logical "0" value, the storage element 108 may be programmed to the second state 144. To illustrate, a series of programming voltage steps may be applied to the flash memory cell to adjust a threshold value of the flash memory cell to increasingly higher voltages until the threshold value equals or exceeds a first verify voltage 233. After programming the flash memory cell according to the first write operation 201, a state of the flash memory may be determined by performing a sense operation at the first sensing voltage (V1) 232. For example, the first sensing voltage 232 may be applied to a control gate of the flash memory cell to determine whether the flash memory cell is activated by the first sensing voltage 232 (i.e. to determine whether the threshold voltage of the flash memory cell is greater than or less than the first sensing voltage 232). The storage element 108 may be determined to have a logical "1" value when the threshold voltage of the flash memory cell does not exceed the first sensing voltage 232 and to have a logical "0" value otherwise.

A second graph 204 depicts permitted states of the storage element 108 resulting from a second write operation 203 (i.e. the second state 144 and the third state 146 corresponding to the second set of states 150). The storage element 108 may be programmed to the second state 144 in response to being assigned a logical "1" value or to the third state 146 in response to being assigned a logical "0" value. The storage element 108 may be programmed to the second state 144 or to the third state 146 by applying a series of programming pulses until the threshold voltage of the storage element 108 meets or exceeds a second verify voltage 235. Note that a storage element having been assigned a logical "1" value in the first write operation 201 and continuing to have a logical "1" value in the second write operation 203 is programmed from the first state 142 to the second state 144. A storage element having a logical "0" value in the second write operation 204 is programmed from either the first state 142 or the second state 144 to the third state 146. A data value stored in the storage element 108 may be determined by performing a sensing operation at the second sensing voltage 234. For example, the second sending voltage 234 may be applied to a control gate of the flash memory cell (the storage element 108) and the flash memory cell may be determined to have a logical "1" value when the flash memory cell's threshold voltage does not exceed the second sensing voltage 234 or to have a logical "0" value otherwise.

A third graph 206 depicts a third set of states 252 as permitted states of the storage element 108 in response to performing a third write operation 205. The third write operation 205 programs the storage element 108 into one of the third state 146 and the fourth state 190. Programming the storage element 108 to the fourth state 190 may be performed by applying a series of programming voltage pulses to increase the threshold voltage of the storage element 108 to meet or exceed a third verify voltage 237. After performing the third write operation 205 to program the storage elements of the group 106 to the third set of states 252, a data value stored in the storage element 108 may be determined by applying a sensing operation using the third sensing voltage 236.

By programming the storage element 108 during successive write operations to be within the specified set of states (e.g. not allowing the storage element 108 to remain in the first state 142 in response to a logical "1" value being assigned in successive write operations), a maximum programming time to program the storage element 108 during each programming operation is reduced. To illustrate, a first example of an implementation where storage elements are allowed to remain in a state through multiple write operations is illustrated by a first distribution of states 208 and a first graph of programming steps 210, for comparison to a second distribution of states 218 and a second graph of programming steps 220 corresponding to one or more embodiments of the present disclosure.

The first example of the distribution of states 208 illustrates a storage element that remains in the first state 142 (e.g. stores a logical "1" value) during a first write operation and a second write operation and that stores a logical "0" value in a third write operation. The third write operation would include programming the storage element from the first state to the fourth state. The first graph of programming sets 210 illustrates voltages of programming steps along a vertical axis and an amount of time along a horizontal axis. The graph 210 depicts a number of programming steps required to raise the threshold voltage from the first state to the fourth state. As an illustrative example, programming from the first state to the fourth state may be performed using eight programming steps, beginning at time 0 and ending at a time t1.

In contrast to the implementation depicted by the graphs 208-210, the storage element 108 according to the present disclosure is programmed to the second state 144 as a result of the second write operation 203, as illustrated in the second example of the distribution of states 218. When the third write operation 205 causes the storage element 108 to be assigned to the logical "0" value corresponding to the fourth state 190, an amount of threshold voltage change to be applied to the storage element 108 is reduced as compared to the first example of the distribution of states 208. As illustrated in the second graph of programming steps 220, programming the storage element 108 from the second state 144 to the fourth state 190 may require a reduced number of steps (e.g. five steps) as compared to the first graph 210 (e.g. eight steps). The second graph 220 illustrates that programming of the storage element 109 ends at a time t2 that is earlier than time t1.

By updating the state of storage elements at each write operation to be within the assigned set of states (e.g. the second write operation 203 assigns the storage device 108 to the second set of states 150 that excludes the first state 142), the largest change in threshold voltage (and the largest corresponding amount of time required to program the storage element 108 to a new state), is limited to that of a two-state transition. Therefore, a write delay that may otherwise be caused by programming a storage element over a larger number of states (such as illustrated in the graphs 208-210) may be avoided. Further, programming the storage element 108 from the first state 142 to the second state 144, even though there is no change in the data value stored at the storage element 108 by the second write operation 203, does not impact a data write time when performing the second write operation 203. For example, during the second write operation 203, some storage elements within the group of storage elements 106 may be programmed from the first state 142 to the second state 144 and other storage elements may be programmed from the first state 142 to the third state 146. Therefore, in this case, programming the storage element 108 from the first state 142 to the second state 144 may be accomplished in parallel with programming other storage elements of the group 106 and without increasing a write latency of the second write operation 203.

Figure 3:
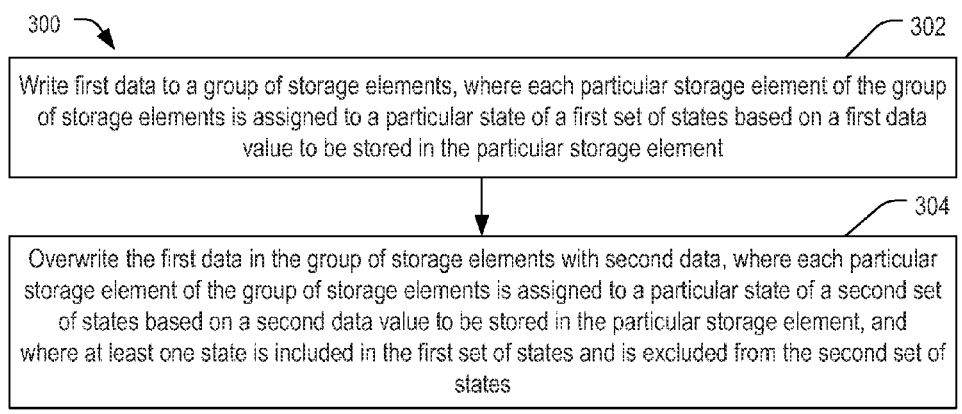
FIG. 3 is a flow chart of a particular illustrative embodiment of a method of overwriting first data with second data without performing an intervening erase operation.

Referring to FIG. 3, a particular embodiment of a method 300 is depicted. The method 300 may be performed in a data storage device, such as the data storage device 102 of FIG. 1. The method 300 includes writing first data to a group of storage elements, at 302. Each particular storage element of the group of storage elements is assigned to a particular state of a first set of states based on a first data value to be stored in the particular storage element. For example, based on the first set of states 148 of FIG. 1, each storage element of the group 106 may be assigned to the first state 142 (e.g. to store a "1" data value) or to the second state 144 (e.g. to store a "0" data value).

The method 300 also includes overwriting the first data in the group of storage elements with second data, at 304. Each particular storage element of the group of storage elements is assigned to a particular state of a second set of states based on a second data value to be stored in the particular storage element. At least one state is included in the first set of states and is excluded from the second set of states. For example, the second set of states 150 of FIG. 1 excludes the first state 142 that is included in the first set of states 148. To perform the overwrite, each storage element of the group 106 may be assigned to the second state 144 (e.g. to store a "1" data value) or to the third state 146 (e.g. to store a "0" data value).

The first set of states may include a first state and a second state. For example, the first set of states 148 of FIG. 1 includes the first state 142 and the second state 144. The second set of states may include the second state and a third state but not the first state. For example, the second set of states 150 of FIG. 1 includes the second state 144 and the third state 146, but not the first state 142.

While the first data is stored in the group of storage elements, the first state may correspond to a first logical value and the second state may correspond to a second logical value. To illustrate, while the first data 160 of FIG. 1 is written to the group 106, the storage element 108 having the first state 142 may correspond to a logical "1" value and the storage element 108 having the second state 144 may correspond to a logical "0" value. While the second data is stored in the group of storage elements, the second state may correspond to the first logical value and the third state may correspond to the second logical value. To illustrate, while the second data 162 of FIG. 1 is written to the group 106, the storage element 108 having the second state 144 may correspond to a logical "1" value and the storage element 108 having the third state 146 may correspond to a logical "0" value.

The group of storage elements may include flash memory cells, such as described with respect to FIG. 2. The first state may correspond to a threshold voltage of a memory cell being less than a first sensing voltage, such as the first state 142 corresponding to a threshold voltage that is less than the first sensing voltage 232 of FIG. 2. The second state may correspond to the threshold voltage being greater than the first sensing voltage and less than a second sensing voltage, such as the second state 144 corresponding to a threshold voltage greater than the first sensing voltage 232 and less than the second sensing voltage 234. The third state may correspond to the threshold voltage being greater than the second sensing voltage, such as the third state 146 corresponding to a threshold voltage greater than the second sensing voltage 234 (and less than the third sensing voltage 236).

Overwriting stored data in the group of storage elements may result in a maximum of a two-state threshold voltage change of any storage element of the group of storage elements. For example, as described with respect to the second example of the distribution of states 218 of FIG. 2, each storage element undergoes at most a two-state threshold voltage change during an overwrite operation. A number of programming voltage steps to overwrite stored data in the group of storage elements (illustrated as five programming voltage steps in the second graph of programming steps 220 of FIG. 2) may be constrained to be less than a number of programming voltage steps to program a storage element from a lowest threshold voltage state to a highest threshold voltage state (illustrated as eight programming voltage steps in the first graph of programming steps 210 of FIG. 2). A number of programming voltage steps to overwrite stored data in the group of storage elements may be constrained to be less than a number of programming voltage steps to cause a three-state transition in a storage element. For example, as depicted in FIG. 2, a number of programming voltages steps to transition one or two states (e.g. from state Er to A, Er to B, A to B, or A to C) may be constrained to be less than a number of programming voltage steps to transition from state Er to C (i.e. a three-state transition)

One or more additional write operations may be performed to the group of storage elements without performing an erase operation. Upon completion of each of the additional write operations, each particular storage element of the group of storage elements is assigned to a particular state of a designated set of states that corresponds to the additional write operation. For example, upon completion of the first write operation 201 of FIG. 2, each storage element in the group 106 may be assigned to a state of the first set of states 148. Upon completion of the second write operation 203, each storage element in the group 106 may be assigned to a state of the second set of states 150, and upon completion of the third write operation 205, each storage element in the group 106 may be assigned to a state of the third set of states 252. After performing the one or more additional write operations, an erase operation may be performed to the group of storage elements.

Although various components depicted herein are illustrated as block components and described in general terms, such components may include one or more microprocessors, state machines, or other circuits configured to enable a controller (e.g. the multiple programmable cell write engine 140 within the controller 120 of FIG. 1) to assign storage elements storing data based on a first set of states to states within a second set of states to enable the data to be overwritten using the second set of states. For example, the multiple programmable cell write engine 140 may represent physical components, such as hardware controllers, state machines, logic circuits, or other structures, to enable the multiple programmable cell write engine 140 of FIG. 1 to assign states of a second set of states to storage elements in a first set of states to overwrite data that is represented using the first set of states with other data that is represented using the second set of states.

A controller (e.g. the controller 120 including the multiple programmable cell write engine 140) may be implemented using a microprocessor or microcontroller programmed to determine a current set of states of a group of storage elements, to assign each storage element to a particular state of a next set of states according to a logical data value assigned to the storage element (where at least one state of the current set of states is excluded from the next set of states), and to update a table indicating that the group of storage elements are programmed to the next set of states. In a particular embodiment, the multiple programmable cell write engine 140 is implemented by a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device, including a memory that has a three-dimensional (3D) memory configuration, the data storage device further including a controller associated with operation of a plurality of storage elements, performing:
      writing first data to a group of the storage elements, wherein each particular storage element of the group of storage elements is assigned to a particular state of a first set of states based on a first data value to be stored in the particular storage element; and
      overwriting the first data in the group of storage elements with second data, wherein each particular storage element of the group of storage elements is assigned to a particular state of a second set of states based on a second data value to be stored in the particular storage element,
      wherein at least one state is included in the first set of states and is excluded from the second set of states.

2. The method of claim 1, wherein the first set of states includes a first state and a second state and wherein the second set of states includes the second state and a third state but not the first state.

3. The method of claim 2, wherein:
   while the first data is stored in the group of storage elements, the first state corresponds to a first logical value and the second state corresponds to a second logical value, and
   while the second data is stored in the group of storage elements, the second state corresponds to the first logical value and the third state corresponds to the second logical value.

4. The method of claim 2, wherein the group of storage elements includes flash memory cells, wherein the first state corresponds to a first threshold voltage range, wherein the second state corresponds to a second threshold voltage range, and wherein the third state corresponds to a third threshold voltage range.

5. The method of claim 4, wherein overwriting stored data in the group of storage elements results in a threshold voltage change of each storage element of the group of storage elements that does not exceed a two-state threshold voltage change.

6. The method of claim 5, wherein a number of programming voltage steps to overwrite stored data in the group of storage elements is constrained to be less than a number of programming voltage steps to program the particular storage element from a lowest threshold voltage state to a highest threshold voltage state.

7. The method of claim 5, wherein a number of programming voltage steps to overwrite stored data in the group of storage elements is constrained to be less than a number of programming voltage steps to cause a three-state transition in the particular storage element.

8. The method of claim 1, further comprising performing one or more additional write operations to the group of storage elements without performing an erase operation.

9. The method of claim 8, further comprising, after performing the one or more additional write operations, performing an erase operation to the group of storage elements.

10. A data storage device comprising:
a memory having a three-dimensional (3D) memory configuration, the memory including a plurality of storage elements; and
a controller coupled to the memory, wherein the controller is associated with operation of the plurality of storage elements and is configured to write first data to a group of the storage elements of the memory, wherein each particular storage element of the group of storage elements is assigned to a particular state of a first set of states based on a first data value of the first data, the first data value to be stored in the particular storage element, and wherein the controller is further configured to overwrite the first data in the group of storage elements with second data, wherein each particular storage element of the group of storage elements is assigned to a particular state of a second set of states based on a second data value of the second data, the second data value to be stored in the particular storage element, wherein at least one state is included in the first set of states and is excluded from the second set of states.

11. The data storage device of claim 10, wherein the first set of states includes a first state and a second state and wherein the second set of states includes the second state and a third state but not the first state.

12. The data storage device of claim 11, wherein:
while the first data is stored in the group of storage elements, the first state corresponds to a first logical value and the second state corresponds to a second logical value, and
while the second data is stored in the group of storage elements, the second state corresponds to the first logical value and the third state corresponds to the second logical value.

13. The data storage device of claim 11, wherein the memory includes a flash memory and wherein the group of storage elements includes flash memory cells of the flash memory.

14. The data storage device of claim 13, wherein the first state corresponds to a threshold voltage of a flash memory cell being less than a first sensing voltage, wherein the second state corresponds to the threshold voltage being greater than the first sensing voltage and less than a second sensing voltage, and wherein the third state corresponds to the threshold voltage being greater than the second sensing voltage.

15. The data storage device of claim 14, wherein overwriting stored data in the group of storage elements results in a threshold voltage change of each storage element of the group of storage elements that does not exceed a two-state threshold voltage change.

16. The data storage device of claim 15, wherein a number of programming voltage steps to overwrite stored data in the group of storage elements is constrained to be less than a number of programming voltage steps to program the particular storage element from a lowest threshold voltage state to a highest threshold voltage state.

17. The data storage device of claim 15, wherein a number of programming voltage steps to overwrite stored data in the group of storage elements is constrained to be less than a number of programming voltage steps to cause a three-state transition in the particular storage element.

18. The data storage device of claim 10, wherein the controller is further configured to perform one or more additional write operations to the group of storage elements without performing an erase operation.

19. The data storage device of claim 18, wherein the controller is further configured, after performing the one or more additional write operations, to perform an erase operation to the group of storage elements.

20. The data storage device of claim 10, wherein the data storage device is configured to be removably coupled to a host device.

* * * * *